(12) United States Patent
Pearson et al.

(10) Patent No.: US 6,911,886 B2
(45) Date of Patent: Jun. 28, 2005

(54) FLUX COIL SYSTEM

(75) Inventors: William R. Pearson, Roanoke, VA (US); Jordan Brantley Casteel, Roanoke, VA (US); Douglas G. Fowley, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 125 days.

(21) Appl. No.: 10/637,981

(22) Filed: Aug. 8, 2003

(65) Prior Publication Data

US 2005/0030146 A1 Feb. 10, 2005

(51) Int. Cl.[7] .............................................. H01F 38/20
(52) U.S. Cl. ........................................................ 336/174
(58) Field of Search ..................... 336/65, 83, 173–175, 336/200, 232; 363/144

(56) References Cited

U.S. PATENT DOCUMENTS

| | | | |
|---|---|---|---|
| 3,742,410 A | * | 6/1973 | Smith ........................... 336/65 |
| 3,976,868 A | | 8/1976 | Lane ........................... 235/184 |
| 4,011,489 A | | 3/1977 | Franz et al. ................. 318/227 |
| 4,399,395 A | | 8/1983 | Espelage ..................... 318/803 |
| 4,698,740 A | * | 10/1987 | Rodgers et al. ................ 363/89 |
| 5,017,859 A | * | 5/1991 | Engel et al. ................. 324/127 |
| 5,521,811 A | | 5/1996 | Levran et al. ............... 363/144 |
| 6,060,978 A | * | 5/2000 | Marquardt ................... 336/234 |
| 6,617,950 B2 | * | 9/2003 | Gilmore et al. ............. 336/229 |
| 6,759,840 B2 | * | 7/2004 | Marasch et al. ......... 324/117 H |

* cited by examiner

*Primary Examiner*—Tuyen T Nguyen
(74) *Attorney, Agent, or Firm*—Ohlandt, Greeley, Ruggiere & Perle

(57) ABSTRACT

A flux coil system has a first member having a first surface and a first flux coil being disposed in the first member. The flux coil has a first current flowing conduit having a second surface. When current traverses through the first current flowing conduit a first magnetic field is induced. The first surface is adjacent to the second surface such that the first flux coil is in the first magnetic field so that a signal is developed corresponding to the first magnetic field.

23 Claims, 5 Drawing Sheets

FLUX COIL SYSTEM

BACKGROUND OF INVENTION

1. Field of the Invention

The present disclosure relates to a flux coil system. More particularly, the present disclosure relates to a flux coil system with a flux coil disposed adjacent to a power bus bar.

2. Description of the Related Art

Flux coils are known in the art. Flux coils are used to inductively detect the magnitude and frequency of alternating current flowing in a power line.

These flux coils have been disposed around or encompass the power line to detect the frequency and the magnitude of the magnetic field generated by the current in the power line. This frequency and magnitude of the magnetic field can be used to determine the frequency and magnitude of the alternating current traversing through the power line.

In order to encompass the power line in high current applications typical flux coils have been toroidially shaped or donut shaped. The flux coil is usually a wire that is shaped into a toroid or a donut shape and is wrapped around the power line.

Additionally, this toroidially shaped arrangement is practically unsuitable for use with such power bus bars. Power bus bars are generally rectangular in shape. Additionally, the toroidially shaped flux coils must penetrate the geometry of the power bus bar. This defeats the advantages for using the power bus bars. This additional wiring to penetrate the power bus bars may cause additional decreases in productivity and increased installation costs.

Additionally, the toroidially shaped flux coils must be formed post installation. A diameter of the toroidially shaped flux coil being wound around the power bus bar must be relatively large to accommodate the power bus bar's rectangular geometry. This results in an increase in costs attributed to the installation. Further, given the close spacing of the power bus bars that are disposed adjacent to one another, a flux or magnetic field from other power bus bars can potentially create an error in an output signal being measured by the flux coil.

Thus, there is a need in the art for a flux coil system that overcomes one or more of the aforementioned deficiencies of prior flux coil systems.

SUMMARY OF THE INVENTION

A flux coil system is provided. The flux coil system has a first member having a first surface, a first flux coil being disposed in the first member, and a first current flowing conduit. The first current flowing conduit has a second surface so that when current traverses through the first current flowing conduit a first magnetic field is induced. The first surface is adjacent to the second surface such that the first flux coil is in the first magnetic field so that a signal is developed corresponding to the first magnetic field.

A flux coil system is provided having a first housing with a first surface and a first flux coil disposed in the first housing. The flux coil system has a second housing having a second surface and a second flux coil being disposed in the second housing. The flux coil system has a compensator being in electrical communication with the first flux coil and the second flux coil. The flux coil system further has a first current flowing conduit with a third surface and a second current flowing conduit having a fourth surface. When current traverses through the first current flowing conduit and the second current conduit a first magnetic field and a second magnetic field are induced. The first surface is adjacent to the third surface and the second surface is adjacent to the fourth surface so a first signal is induced in the first flux coil and a second signal is induced in the second flux coil. The compensator generates an amplitude and/or a frequency of the current from the first signal and the second signal.

DETAILED DESCRIPTION OF THE INVENTION

Figure 1:
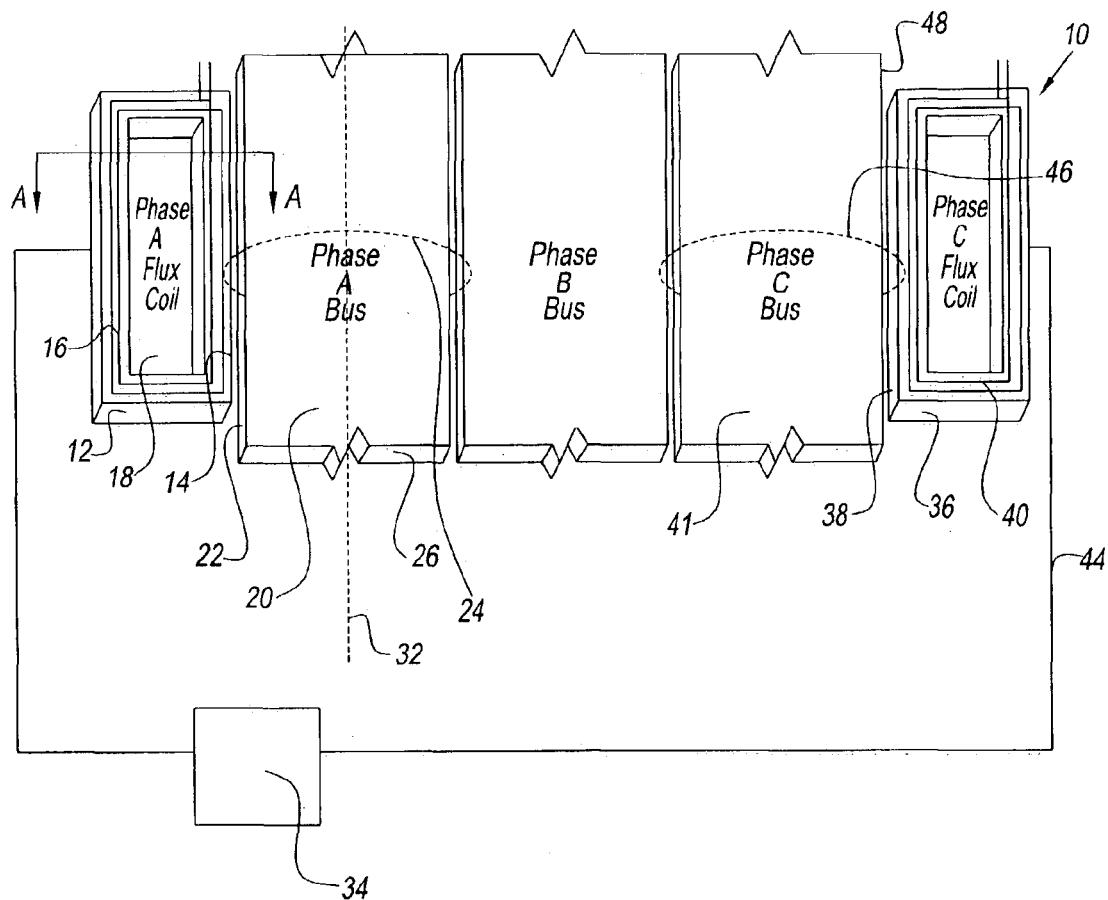
FIG. 1 is a bottom perspective view of a flux coil system.
Figure 2:
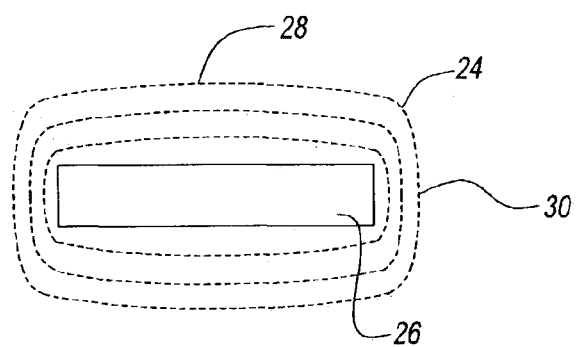
FIG. 2 is an end view of a power bus bar of FIG. 1.
Figure 3:
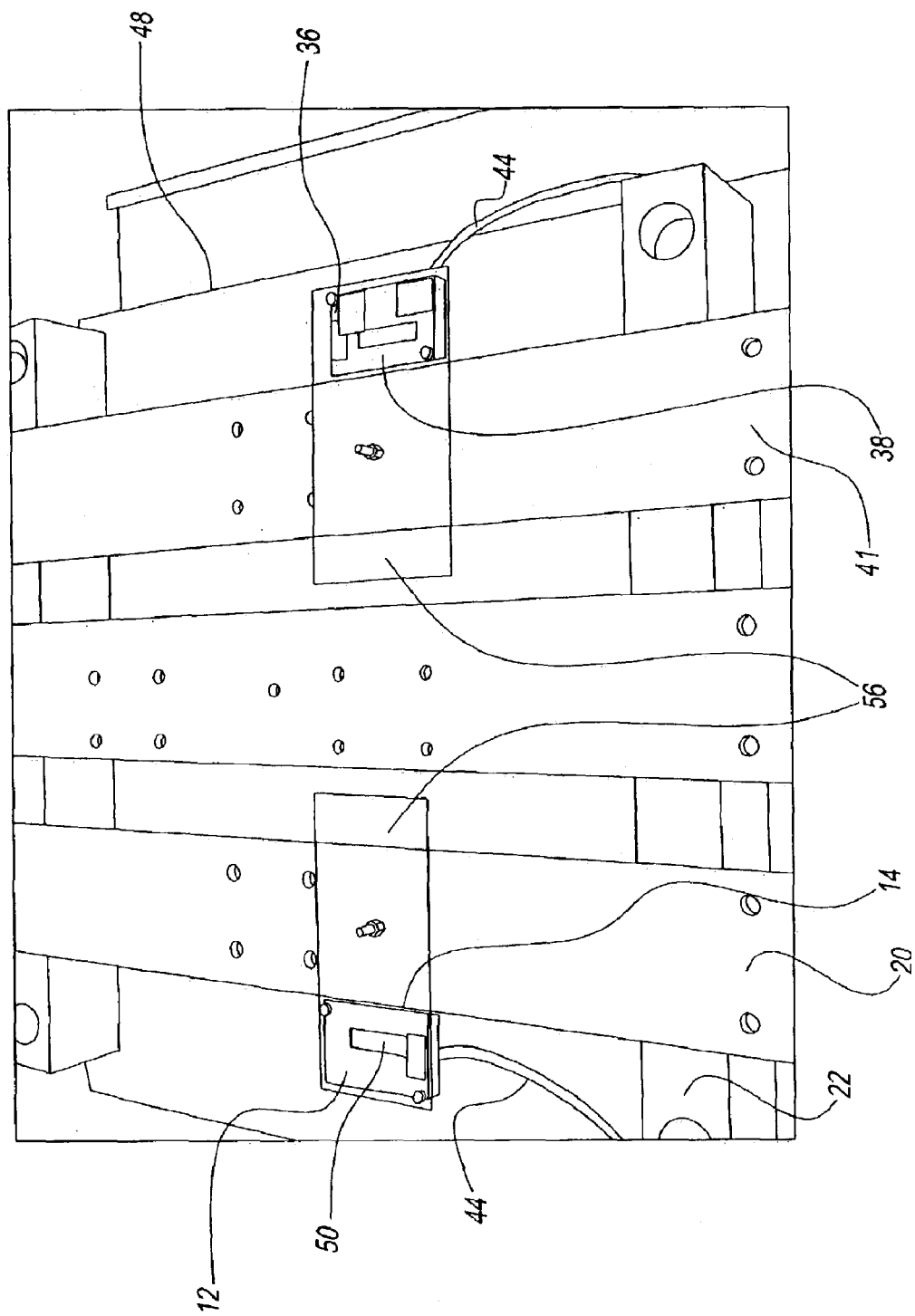
FIG. 3 is a top perspective view of the flux coil system of FIG. 1.

With reference to FIGS. 1 through 3, there is shown a flux coil system generally represented by reference numeral 10. The flux coil system 10 has a first member 12 having a first surface 14 and a first flux coil 16 being disposed in the first member 12. An embodiment of the first member 12 shows an orthogonal shaped housing having an interior space 18. The first surface 14 is a planar surface, however of course the first surface 14 may have any shape known in the art and first member 12 can have any shape known in the art suitable to house the first flux coil 16. The flux coil system 10 further has a first current flowing conduit 20 having a second surface 22.

One skilled in the art should appreciate that the flux coil system 10 may be used in any current flowing conduit 20 being known in the art, including but not limited to a wire, a cable, a coupler, or a power converter. In one embodiment, the flux coil system 10 is used with the first current flowing conduit 20 such as a first power bus bar 20.

Referring to FIG. 2, as a current traverses through the first power bus bar 20, the current induces a first magnetic field 24. As can be understood from the drawings, the first magnetic field 24 is unevenly distributed. More particularly, the first magnetic field 24 has relatively denser sections of magnetic flux and relatively less dense or sparse sections of magnetic flux depending upon a geometry of the first power bus bar 20. Referring to an end 26 of the first power bus bar 20 shown in FIG. 2 there is shown the magnetic field 24. The magnetic field 24 has a first region 28 and a second region 30 both being shown perpendicular to a longitudinal axis 32 of the first power bus bar 20.

In one embodiment, current flowing through the first power bus bar 20 is an alternating current. Referring to FIGS. 1 and 2, the first flux coil 16 is disposed in the second region 30 of the magnetic field 24 such that the first flux coil is in the relatively denser flux of the first magnetic field 24. The first surface 14 is adjacent to the second surface 22 such that the first flux coil 16 is in the magnetic field 24 so that a signal is developed corresponding to the first magnetic field 24. In an embodiment, the first flux coil 16 may be completely in the magnetic field 24, however one skilled in the art should appreciate that the first flux coil 16 may be disposed in any location in the second region 30. The signal that is induced can be proportional to any parameter of the magnetic field 24, including but not limited to, a voltage of the first power bus bar 20, a voltage waveform, a voltage waveform over time, an amplitude of the current, a frequency of the current, and any combinations thereof.

Referring to FIGS. 2 and 3, the first power bus bar 20 has a generally rectangular shaped configuration. As current traverses through the power bus bar 20, the first magnetic field 24 is generated. It has been observed that due to the AC skin effect, first magnetic field 24 is the densest in the second region 30 of the first power bus bar 20.

The first flux coil 16 takes advantage of this relatively dense field in the second region 30 of the power bus bar 20 attributed to the "AC skin effect". In one embodiment, the first flux coil 16 is wound is a generally rectangular configuration and placed in the first member 12 being positioned adjacent to the second surface 22 of the first power bus bar 20. In this manner, the first flux coil 16 is in the second region 30 of the first magnetic field 24. The first flux coil 16 develops a signal corresponding to the first magnetic field 24 and is in electrical communication with a compensator 34.

The compensator 34 generates a frequency and/or an amplitude of the current from the signal. The compensator 34 may also provide a voltage waveform per unit time, frequency and amplitude of the current traversing through the first power bus bar 20. The compensator 34 may also add, subtract or otherwise compensate for any loss of current or voltage in the first power bus bar 20 over time by way of non-linear current, inductance or reactance. In one embodiment, the compensator 34 reconstructs the current traversing therethrough for a more productive application. In one embodiment, the compensator 34 is a controller such as a DSP processor having a software program in a memory. In another embodiment, the compensator 34 is a suitable analog circuit. Of course, one skilled in the art should appreciate that the compensator 34 may be any compensating device known in the art including a combination of any digital and analog devices.

This loss of current or voltage in the first power bus bar 20 over time by way of non-linear current, inductance or reactance is minimized by the flux coil system 10. Referring again to FIGS. 1 and 3, the flux coil system 10 further has a second member 36 having a third surface 38 and a second flux coil 40 being disposed in the second member 36. The first flux coil 16 and the second flux coil 40 are both in electrical communication with the compensator 34 by a wire 44.

The first power bus bar 20 has the second surface 22 being parallel to the first surface 14. A second power bus bar 41 has a fourth surface 48 being parallel to the third surface 38. A current traverses through the first and second power bus bars 20, 41 induces the first magnetic field 24 and a second magnetic field 46. The first surface 14 is adjacent to the second surface 20 to be in the first magnetic field 24 and the third surface 38 is adjacent to the fourth surface 48 to be in the second magnetic field 46. This positioning allows the first flux coil 16 and the second flux coil 40 to be in respective regions of the denser flux. This position prevents any error in the signal arising from another magnetic field, for example from another power bus bar or other electrical components that are adjacent to, or in close proximity to the flux coil system 10.

The first flux coil 16 develops a first signal of the first magnetic field 24 and the second flux coil 40 develops a second signal of the second magnetic field 46. The compensator 34 generates an amplitude and/or a frequency of the current from the first signal and the second signal. The compensator 34 then reconstructs the current based in part upon the first signal and the second signal to resemble a substantially sinusoidal shaped voltage waveform.

Figure 4:
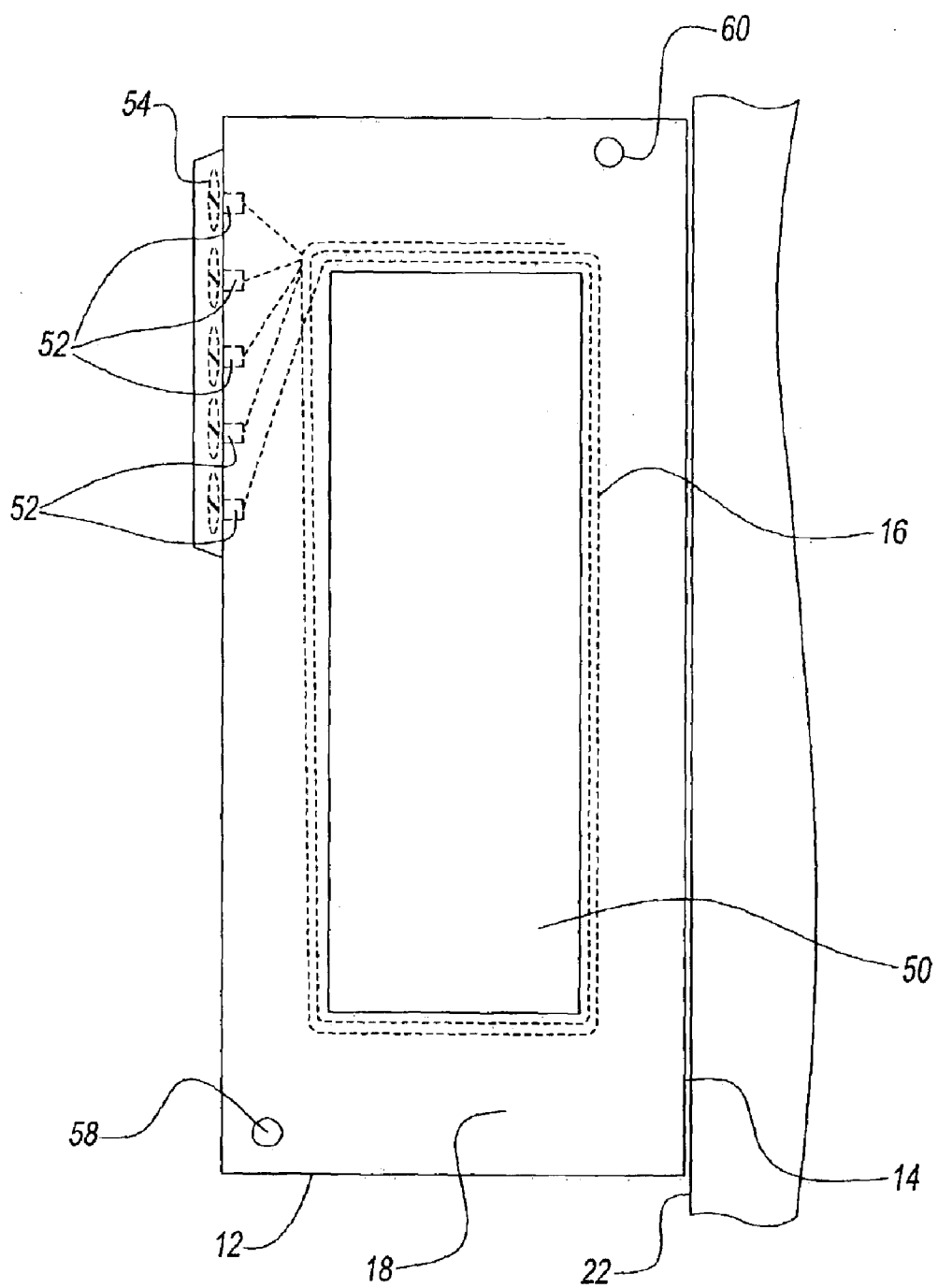
FIG. 4 is a cross section view of the flux coil system of FIG. 1 along line A—A.

Referring to FIG. 4, there is shown an interior view of the first member 14 being shown along line A—A of FIG. 1. The first flux coil 16, like the second flux coil 40 is a wire being wound around a core 50. The first and second flux coils 16, 40 are each wound, in one embodiment for 800 turns in a generally rectangular shaped fashion. In this embodiment, the first flux coil and second flux coil 16, 40 are each wound with a number of taps 52. One skilled in the art should appreciate that the first and second flux coils 16, 40 may have any number of taps 52. The taps 52 are each disposed at about two hundred turns of the respective first and second flux coil 16, 40.

The wire of the first flux coil 16 is, in one embodiment, a #40 American Wire Gauge copper magnet wire with an insulation that is suitable for 140 degrees Celsius ambient operation. Additionally, current traversing through the first flux coil 16 and second flux coil 40 does not exceed about 2 milli-amps. The first flux coil 16 and the second flux coil 40 in one embodiment have a thickness in a range that includes 0.375 inches. Of course, one skilled in the art should appreciate that the first and second flux coils 16, 40 may have any size, shape or thickness being known in the art.

The core 50 is disposed in a centermost region of each of the first flux coil 16 and the second flux coil 46. The core 50 may be air, a ceramic material, or a non-magnetic bobbin. The core 50 is substantially rectangular in shape and is about 2 centimeters by 6 centimeters. Of course, one skilled in the art should appreciate that the core may have any size, be any suitable material or have any suitable configuration known in the art. The first member 12 is shown as rectangular in shape and has one or more screw terminals 54 for accommodating the taps 52. The taps 52 are disposed on a lateral side thereof for coupling to the compensator 34. Of course, the taps 52 may be disposed in any location on the first member 12. The first member 12 encapsulates the flux coil 16 to provide suitable voltage isolation.

One of the significant aspects of the flux coil system 10 is the easy of installation. The first flux coil 16 and second flux coil 40 are not disposed winding around the first power bus bar 20 which could potentially give a false reading. The first flux coil 16 and second flux coil 40 do not penetrate the circuitry of any power line, which could potentially increase the costs associate with installation.

Instead, the first flux coil 16 is disposed adjacent the first surface 14 and the second flux coil 40 is disposed adjacent the fourth surface 48. In one embodiment, the flux coil system may further have a suitable sensor (not shown). Sensor measures voltage being induced in the first and second flux coils 16, 40. The sensor outputs a signal to the compensator 34 that is proportional to the voltage drop across the equivalent reactance current.

The compensator 34 reconstructs the current to compensate for the reactance. The voltage waveform of the line to line voltage being delivered to the first power bus bar 20, in one embodiment, reconstructed to be a substantially pure sine wave.

Figure 5:
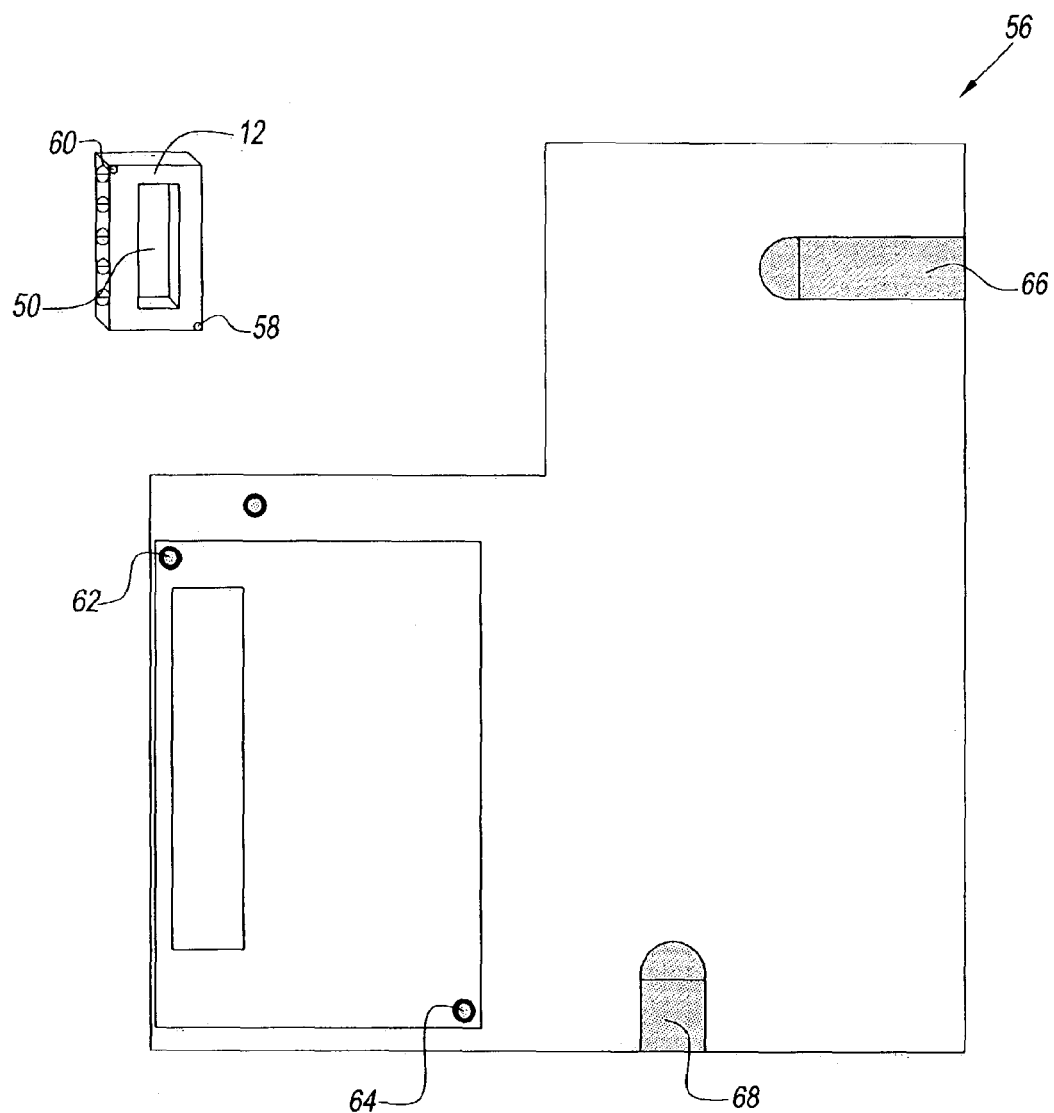
FIG. 5 is a top perspective view of a bracket of FIG. 2.

Referring to FIG. 5, the flux coil system 10 may further optionally have a bracket 56. The first flux coil 16 is held in position by the bracket 56. The bracket 56 maintains the respective first and second flux coils 16, 40 in position with regard to the bus bars so that the first and second flux coils 16, 40 are in the respective dense portions of the respective magnetic field. In an embodiment, as can be understood from the drawings, the first flux coil 16 is placed flush with the first power bus bar 20 as close as possible such that a contact area defined therebetween is maximized as shown in FIG. 3. Of course, one skilled in the art should appreciate that the first and the second flux coils 16, 40 may be fastened to the respective bus bar by any manner known in the art. Additionally, the first and second flux coils 16, 40 may even be placed apart from the respective bus bar an amount so long as the respective flux coil is in the respective magrietic field. This includes being connected directly to the bus bar, being spaced apart from the bus bar or being connected to the respective bus bar by an intermediate member (not shown).

In an embodiment, the first member 12 has a first screw hole 58 and a second screw hole 60 disposed therethrough to assist being held on the bracket 56. The bracket 56 is shown as a "L" shaped member that mounts in position on the first power bus bar 20. The bracket 56 has a pair of screw holes 62, 64. The first flux coil 16 is placed and secured on the bracket 56 by a first and a second screw (not shown) being disposed through the first screw hole 58, the second screw hole 60 and the pair of screw holes 62, 64. Thereafter, the bracket 56 having the first flux coil 16 being disposed thereon is positioned adjacent to the first power bus bar 20 using the first and second mounting slots 66, 68. These slots engage with a complementary structure on the first power bus bar 20.

Figure 6:
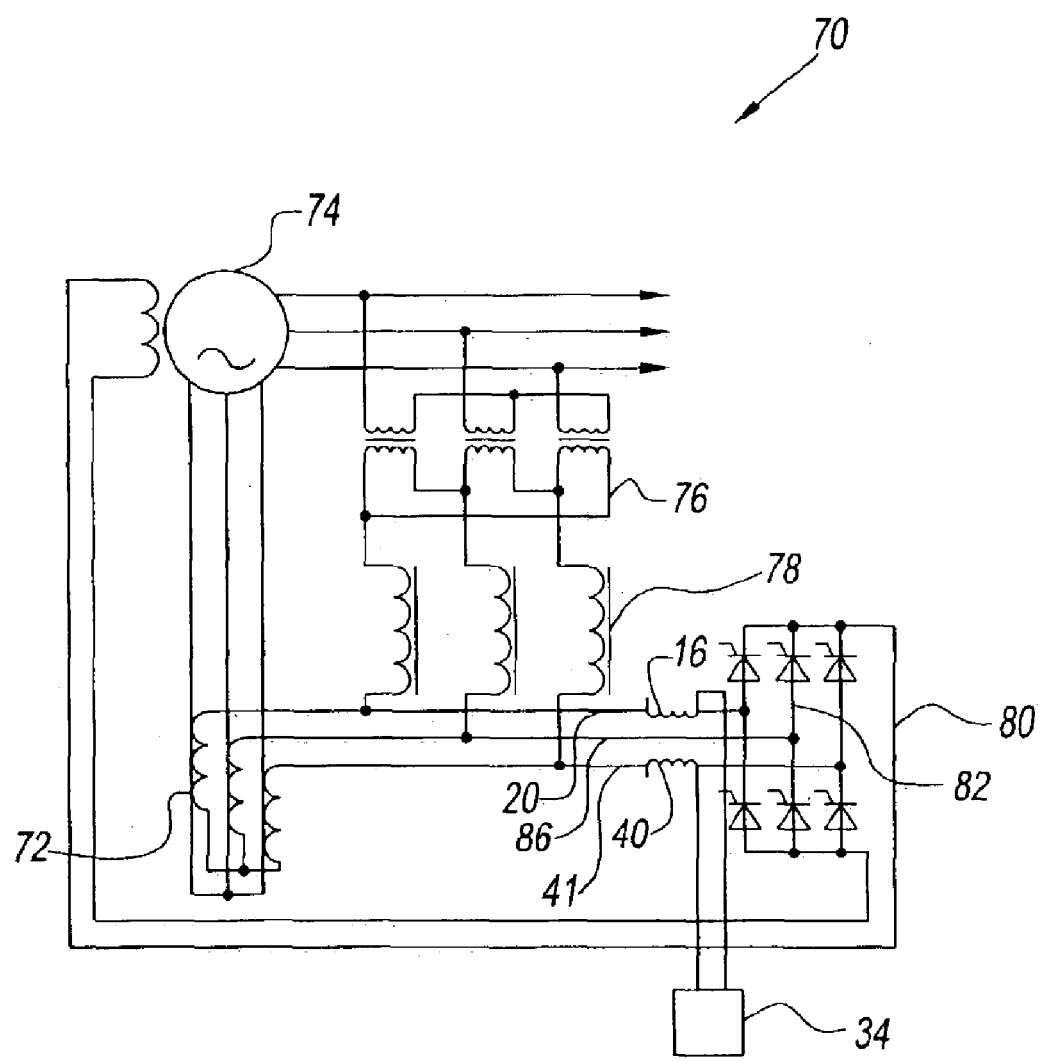
FIG. 6 is a circuit diagram of a power circuit for a compound source excitation system having the flux coil system of FIG. 1.

Referring to FIG. 6, although the flux coil system 10 may be used with any current flowing conduit known in the art, the flux coil system 10 is illustrated as being provided in a compound source excitation system or exciter being generally represented as reference numeral 70. The exciter 70 has a power current transformer 72 being coupled to a generator 74. The generator 74 generates at least a three phase(3φ) power source. The power current transformer 72 provides power being proportional to a load current of the generator 74.

The exciter 70 also has a power potential transformer 76 in electrical communication with a linear reactor 78. The power potential transformer 76 provides voltage to the exciter 70 through linear reactor 78, where the voltage is proportional to a generator output voltage of the generator 74.

The exciter 70 also has a thyristor power converter system 80 having one or more thyristors 82. The thyristor power converter system 80 is in electrical communication with the power current transformer 72. Given that the exciter 70 is a high output polyphase system, the thyristor power converter system 80 is coupled to the power current transformer 72 by a coupler. The coupler is a current flowing conduit, more particularly, the first power bus bar 20, the second power bus bar 41 and a third power bus bar 86. These accommodate the three phase or polyphase power.

The exciter 70 further has the compensator 34. The thyristor power converter system 80 is controlled by the compensator 34 for the ac to dc power converter to be synchronized to the first power bus bar 18, the second power bus bar 86 and the third power bus bar 41. This allows for a coordinated firing of the thyristors 82 to regulate an output. The synchronization is accomplished in accordance with the present disclosure by sensing the appropriate line voltages for the load side of the power current transformer 72 connected to the source side of the thyristor power converter system 80. Then, by utilizing these signals via the compensator 34 a voltage waveform over time is developed from which synchronizing pulses are generated.

The present disclosure having been thus described with particular reference to the preferred forms thereof, it will be obvious that various changes and modifications may be made therein without departing from the spirit and scope of the present disclosure as recited in the claims.

What is claimed is:

1. A flux coil system comprising:
   a first member having a first surface;
   a first flux coil being disposed in said first member; and
   a first current flowing conduit having a second surface so that when current traverses through said first current flowing conduit a first magnetic field is induced, said first surface being adjacent to said second surface such that said first flux coil is in said first magnetic field so that a signal is developed corresponding to said first magnetic field.

2. The flux coil system of claim 1, wherein said first magnetic field has a dense portion and a sparse portion, and wherein said first flux coil is in said dense portion.

3. The flux coil system of claim 1, further comprising a compensator being in electrical communication with said first flux coil, said compensator generating a frequency and/or an amplitude of said current from said signal.

4. The flux coil system of claim 1, further comprising a second current flowing conduit having a third surface;
   a second member having a fourth surface; and
   a second flux coil being disposed in said second member so that when said current traverses through said second current flowing conduit a second magnetic field is induced, said third surface being adjacent to said fourth surface such said second flux coil is in said second magnetic field so that a second signal is developed corresponding to said second magnetic field.

5. The flux coil system of claim 4, wherein said second magnetic field has a dense portion and a sparse portion, and wherein said second flux coil is in said dense portion.

6. The flux coil system of claim 4, wherein a compensator generates a frequency and/or an amplitude of said current traversing through said first current flowing conduit and said second current flowing conduit from said first signal and said second signal.

7. The flux coil system of claim 3, wherein said compensator is a controller and a software program generating said frequency and/or said amplitude of said current.

8. The flux coil system of claim 3, wherein said first and second flux coils are wound in a rectangular manner.

9. The flux coil system of claim 1, wherein said first current flowing conduit is a first power bus bar.

10. The flux coil system of claim 1, wherein said first flux coil is disposed completely in said first magnetic field.

11. The flux coil system of claim 4, wherein said second flux coil is disposed completely in said second magnetic field.

12. The flux coil system of claim 7, wherein said first member is encapsulated to be substantially isolated from said current.

13. The flux coil system of claim 3, wherein said first member has a plurality of apertures corresponding to a plurality of taps being in electrical communication with said compensator.

14. The flux coil system of claim 1, wherein said first flux coil is a wire being wound around a core.

15. The flux coil system of claim 1, wherein said first flux coil is a copper magnet wire being wound in a substantially rectangular fashion.

16. The flux coil system of claim 1, wherein said first flux coil is wound with about 800 turns.

17. The flux coil system of claim 14, wherein said core is selected from the group consisting of air, a non-magnetic material, a non-magnetic bobbin, a ceramic material and any combinations thereof.

18. A flux coil system comprising:
a first housing having a first surface;
a first flux coil being disposed in said first housing;
a second housing having a second surface;
a second flux coil being disposed in said second housing;
a compensator being in electrical communication with said first flux coil and said second flux coil;
a first current flowing conduit having a third surface; and
a second current flowing conduit having a fourth surface so that when current traverses through said first current flowing conduit and said second current conduit a first magnetic field and a second magnetic field are induced, said first surface being adjacent to said third surface and said second surface being adjacent to said fourth surface so a first signal is induced in said first flux coil and a second signal is induced in said second flux coil, wherein said compensator generates an amplitude and/or a frequency of said current from said first signal and said second signal.

19. The flux coil system of claim 18, wherein said first housing and said second housing are rectangular.

20. The flux coil system of claim 18, wherein said first flux coil and said second flux coil are a copper wire being wound in a rectangular fashion.

21. The flux coil system of claim 18, wherein said compensator is selected from the group consisting of a controller operatively being coupled to a software program, an analog circuit, a digital circuit, and any combinations thereof.

22. The flux coil system of claim 18, wherein said first current flowing conduit and said second current flowing conduit are one or more power bus bars.

23. The flux coil system of claim 18, wherein said first flux coil and said second flux coil each have a copper magnet wire being wound around a core with about n turns, and wherein n is dependent upon a parameter being selected from the group consisting of a function of a line voltage, a reactance, a length of said first housing, a length of said second housing, and any combinations thereof.

* * * * *